United States Patent [19]

Kawano et al.

[11] Patent Number: 4,602,371
[45] Date of Patent: Jul. 22, 1986

[54] HIGH OUTPUT SEMICONDUCTOR LASER DEVICE UTILIZING A MESA-STRIPE OPTICAL CONFINEMENT REGION

[75] Inventors: Toshihiro Kawano, Hachioji; Tsukuru Ohtoshi, Kokubunji; Naoki Chinone, Hachioji; Takashi Kajimura; Michiharu Nakamura, both of Hinodemachi, all of Japan

[73] Assignee: Hitachi, Ltd., Tokyo, Japan

[21] Appl. No.: 571,578

[22] Filed: Jan. 17, 1984

[30] Foreign Application Priority Data

Jan. 17, 1983 [JP] Japan .................................. 58-4175
Feb. 9, 1983 [JP] Japan .................................. 58-18830
Feb. 10, 1983 [JP] Japan .................................. 58-19823

[51] Int. Cl.$^4$ .............................................. H01S 3/19
[52] U.S. Cl. ........................................ 372/45; 357/17; 372/46
[58] Field of Search ....................... 372/45, 46; 357/17

[56] References Cited

U.S. PATENT DOCUMENTS 4,315,226 2/1982 Chinone et al. ...................... 372/45

OTHER PUBLICATIONS

Casey, Jr. et al., *Heterostructure Lasers*, Academic Press, New York, San Francisco, London, 1978, pp. 42–46, 191–194.

H. Blauvelt et al., "AlGaAs Inverted Strip Buried Heterostructure Lasers", Appl. Phys. Lett. 41(5), Sep. 1982, pp. 485–487.

*Primary Examiner*—James W. Davie
*Attorney, Agent, or Firm*—Antonelli, Terry & Wands

[57] ABSTRACT

A semiconductor laser device is provided with an optical confinement region constituted by first, second, third and fourth semiconductor layers provided on the upper part of a predetermined semiconductor substrate in contact with each other successively. The first and fourth semiconductor layers are smaller in refractive index than the second and third semiconductor layers, and the third semiconductor layer is larger in refractive index than the second semiconductor layer. On the other hand, the second and fourth semiconductor layers are larger in forbidden bandwidth than the third semiconductor layer. At least the first and fourth semiconductor layers are opposite in conductivity type to each other. In addition to this, the optical confinement region is formed into a mesa-stripe, and both side walls of this mesa-stripe which are substantially parallel to the traveling direction of a laser beam are embedded with a fifth semiconductor layer. Also, the width of the second semiconductor layer in a section perpendicular to the traveling direction of the laser beam and in the direction parallel to a junction within the optical confinement region is made larger than that of the third semiconductor layer. Accordingly, by virtue of this structure, a large output is ensured by this semiconductor laser device.

24 Claims, 26 Drawing Figures

HIGH OUTPUT SEMICONDUCTOR LASER DEVICE UTILIZING A MESA-STRIPE OPTICAL CONFINEMENT REGION

BACKGROUND OF THE INVENTION

1. Field of the Invention

The present invention relates to a structure of a high-output semiconductor laser device and a method of manufacturing the same.

2. Description of the Prior Art

Hitherto, a large number of attempts have been made to increase the output of semiconductor laser devices. Typical examples of such attempts include providing what is called an optical guiding layer in contact with an active layer and making optical output end surfaces transparent. These techniques, however, have not thoroughly attained the purpose of obtaining a higher output.

SUMMARY OF THE INVENTION

Accordingly, it is an object of the invention to provide a high-output semiconductor laser device.

It is another object of the invention to provide a semiconductor laser device which has a high output as well as a stabilized transverse mode.

It is still another object of the invention to provide a structure of a semiconductor laser device easy to manufacture and a method of manufacturing the same.

The semiconductor laser in accordance with the invention has the following basic structure.

The semiconductor laser of the invention has at least a laser resonant cavity, hereinafter referred to as an optical confinement region, constituted by first, second, third and fourth semiconductor layers formed on the upper part of a predetermined semiconductor substrate in contact with each other successively. The first and fourth semiconductor layers are set so as to be smaller in refractive index than the second and third semiconductor layers, and the third semiconductor layer is set so as to be larger in refractive index than the second semiconductor layer. At least the first and fourth semiconductor layers are provided so as to be opposite in conductivity type to each other. At the same time, the second and fourth semiconductor layers are set so as to be larger in forbidden bandwidth than at least the third semiconductor layer. Thus, carriers are confined in the third semiconductor layer, while photons are confined in the second and third semiconductor layers. The second semiconductor layer is generally referred to as "optical guiding layer"; the third semiconductor layer as "active layer"; and the first and fourth semiconductor layers as "cladding layers". A practical semiconductor laser device may further have a semiconductor layer provided between the substrate and the above-mentioned optical confinement region or on the upper part of the optical confinement region. Also in such a case, the present invention can be applied, and the essential qualities of the invention are not adversely affected by such an application.

Moreover, the width of the second semiconductor layer in a section perpendicular to the traveling direction of the laser beam and in the direction parallel to a pn junction is made larger than that of the third semiconductor layer. In addition, the first to fourth semiconductor layers are formed into a mesa-stripe, and the side walls of the mesa-stripe semiconductor layers extending in the direction perpendicular to the traveling direction of the laser beam are embedded with a fifth semiconductor layer as a buried layer. The fifth semiconductor layer is made smaller than refractive index than at least the second and third semiconductor layers. In this case, it is preferable on the grounds of manufacture that the buried layer should reach the semiconductor substrate. Further, the fifth semicoductor layer may be constituted by a plurality of layers.

Since the width of the optical guiding layer is larger than that of the active layer, it is possible to attain a higher output than in the case where merely the optical guiding layer is provided.

Moreover, it is more preferable to arrange also the structure in section taken along a plane parallel to the traveling direction of the laser beam such that the active layer does not reach the output end surfaces, while the optical guiding layer reaches the output end surface. Since the active layer is embedded with the buried layer, the beam is emitted to the outside mainly from the optical guiding layer, which is suitable for obtaining a higher output as well as advantageous in extending the lifetime.

It is to be noted that when the above-mentioned form is employed the optical confinement region may be constituted by laminating the first to fourth semiconductor layers on the substrate in reverse order to the above-mentioned.

Moreover, in the semiconductor laser device of the invention, the cladding layer on the side of the optical guiding layer is made larger in refractive index than the cladding layer on the opposite side, thereby allowing the transverse mode to be better stabilized and the output to be increased, advantageously.

DETAILED DESCRIPTION OF THE PREFERRED EMBODIMENTS

Embodiment 1

FIGS. 1(a) to 1(f) are sectional views showing steps of a method of manufacturing a semiconductor laser device in accordance with a first embodiment of the invention in the case where the invention is applied to a GaAlAs semiconductor laser device. It is to be noted that the drawings are sectional views taken along the direction perpendicular to the radiation direction of the laser beam.

Figure 1A:
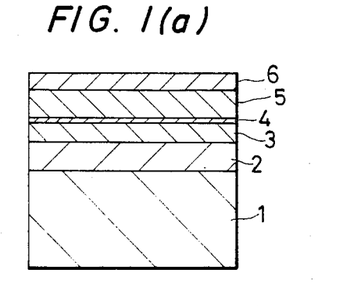
FIGS. 1(a) to 1(f) and 9(a) to 9(f) are sectional views showing the process of manufacturing a semiconductor laser device in accordance with a first embodiment of the invention.

First of all, as shown in FIG. 1(a), an n-GaAs substrate 1 is provided thereon with an n-$Ga_{0.55}Al_{0.45}As$ cladding layer 2 (thickness: from 0.8 to 2 $\mu$m), an n-$Ga_{0.74}Al_{0.26}As$ optical guiding layer 3 (from 0.4 to 3 $\mu$m), an undoped $Ga_{0.86}Al_{0.14}As$ active layer 4 (from 0.04 to 0.4 $\mu$m), a p-$Ga_{0.55}Al_{0.45}As$ cladding layer 5 (from 0.8 to 2 $\mu$m) and a p-$Ga_{0.8}Al_{0.2}As$ cap layer 6 (from 0.5 to 1 $\mu$m) in order by means of liquid phase epitaxial growth. In this case, the refractive index of the n-cladding layer 2 and the p-cladding layer 5 are set to be 3.289, which is smaller than the refractive index of 3.492 of the active layer 4. Moreover, the refractive index of the optical guiding layer 3 is set at a value of 3.412 to be smaller than that of the active layer 4 but larger than that of the n-cladding layer 2. Also, for the particular AlAs mixed crystal ratios of these layers, the respective forbidden bandgaps (EV) for the layers are 1.985 for layers 2 and 5, 1.748 for layer 3 and 1.599 for layer 4. Thus, the forbidden bandwidth for the layers 3 and 5 are higher than that of the active layer 4. It is noted in this regard that the refractive index and forbidden bandwidth are inherent values of the mixed crystal, as discussed, in "Heterostructure Laser, Part A" by H. C. Casey, Jr. and M. B. Panish, Academic Press, 1978. Further, although a GaAs layer is generally employed as the cap layer 6, in this embodiment the $Ga_{0.8}Al_{0.2}As$ layer is employed as mentioned above for the purpose of preventing any buried layer from being epitaxially grown on a mesastripe in the subsequent step of growing buried layers, and for making it easy to obtain an ohmic contact as much as possible.

Figure 1B:
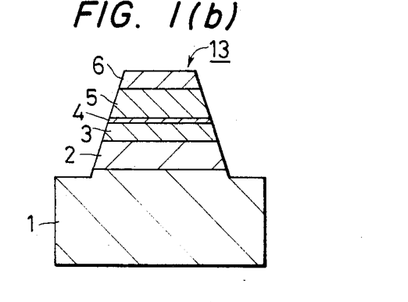

Next, the above-mentioned layers shown in FIG. 1(a) are etched along such a direction that the cross-sectional configuration will be a trapezoid having the upper side smaller than the lower side, to form a mesa-stripe as shown in FIG. 1(b). Although it it not always necessary to form such a mesa-stripe for attaining the structure of the invention, the above-mentioned trapezoidal shape is extremely preferable from the viewpoint of facilitating the formation. In forming this mesa, the etching is effected until the GaAs substrate 1 is exposed in order to facilitate the growth of buried layers as a subsequent step. It is to be noted that in the semiconductor laser device of the invention it is necessary that the width of the optical guiding layer 3 should be larger than that of the active layer 4 in the end.

Such an etching as to obtain a trapezoidal cross-sectional configuration is realized by employing an etching solution of what is called chemical reaction rate-limited type. For example, in the case of a GaAs substrate, a (100) surface is employed, and a striped etching mask is provided on the region to be left in a mesa shape, in the $<01\bar{1}>$ direction. Then, etching is carried out by employing an etching solution constituted by a mixture solution of sulfuric acid, hydrogen peroxide and ethylene glycol. Thus, a mesa portion having a trapezoidal cross-section is realized. Also in case of employing other materials, the mesa portion is realized with a similar idea.

Figure 1C:
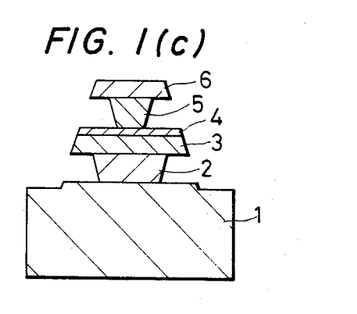

Next, as shown in FIG. 1(c), only the n-cladding layer 2 and the p-cladding layer 5 are etched about several $\mu$m from both sides by means of a selective etching. In this case, HF is employed as a selective etching solution. The cladding layers (2, 5) are selectively etched according to the difference in the AlAs mole fraction of GaAlAs.

Figure 1D:
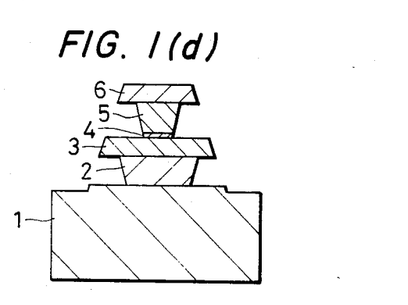

Thereafter, the portions of the active layer 4 exposed by the selective etching are removed by means of an $H_3PO_4$ etching solution to form a cross-sectional configuration as shown in FIG. 1(d).

Figure 1E:
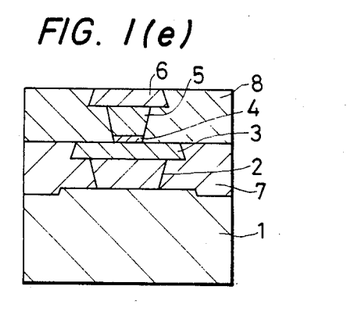

Then, as shown in FIG. 1(e), the whole of the mesa stripe is embedded with a p-$Ga_{0.55}Al_{0.45}As$ buried layer 7 and an n-$Ga_{0.55}Al_{0.45}As$ buried layer 8 by means of liquid phase epitaxial growth. More specifically, since the region other than the mesa-stripe region has a reverse bias, a current flows only through the mesa-stripe region. It is to be noted that the buried layers 7, 8 may be constituted by high-resistance semiconductor layers, e.g., $Ga_{0.55}Al_{0.45}As$ high-resistance layers, respectively. The buried layers may be constituted by a single buried layer, unlike this embodiment which has two buried layers. Moreover, the buried layer may be constituted by a multiplicity of layers.

Figure 1F:
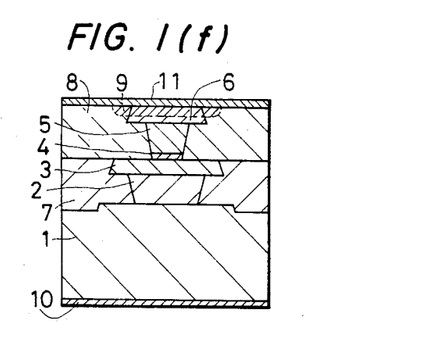

Finally, after Zn 9 is selectively diffused in the portion of the surface layer on the mesa stripe or totally diffused in the whole surface layer, ohmic electrodes 10, 11 are formed to complete an element having such a final cross-section as shown in FIG. 1(f). The reflecting surfaces of the resonator are formed by cleaving the crystal.

As described above, in this embodiment, after the layers are formed on the substrate, the mesa-stripe is formed along such a direction that the cross-sectional configuration is a trapezoid having the upper side smaller than the lower side. Therefore, the semiconductor laser device manufactured through the selective etching of the cladding layers 2, 5 carried out thereafter has such a structure that the width of the side of the optical guiding layer 3 closer to the active layer 4 is larger than the width of the side of the cap layer 6 closer to the substrate 1, and the width of the side of the optical guiding layer 3 closer to the substrate 1 is larger than the width of the side of the optical guiding layer 3 closer to the active layer 4. Accordingly, the width of the p-cladding layer 5 becomes smaller than that of the n-cladding layer 2 correspondingly to allow the width of the active layer 4 to be made exceedingly small (e.g., 3 $\mu$m) advantageously.

In addition, according to this embodiment, the etching for forming the mesa is effected until the substrate 1 is exposed. For this reason, even if the optical guiding layer 3 ($Ga_{1-x}Al_xAs$) has a large AlAs concentration (e.g., x=0.26), the buried layers can be readily grown, and it is possible to form a structure permitting a large output even if the oscillation wavelength is in the visible region.

It is to be noted that according to this embodiment an element can be obtained which is stable in the single transverse mode up to an optical output of 50 mW with an oscillation wavelength of 780 nm. Thus, the transverse mode of the element is stable up to an optical output about three to five times as high as that of an ordinary visible semiconductor laser device; therefore, the element has excellent characteristics.

As has been described, in this embodiment, by forming the mesa-stripe in such a direction that the cross-sectional configuration will be a trapezoid having the upper side smaller than the lower side, the p-cladding layer is made smaller in width than the n-cladding layer correspondingly in the subsequent selective etching step, thereby allowing the active layer width to be made exceedingly small. According to this embodiment, therefore, it is possible to obtain a semiconductor laser device improved to attain a higher output and a stable transverse mode at a high output with a high yield, advantageously.

Figure 1G:
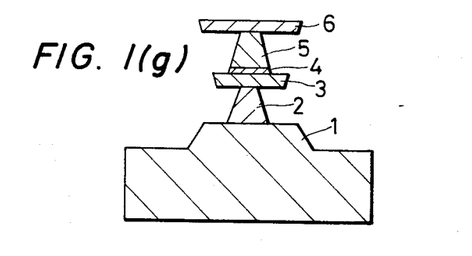
FIG. 1(g) is a sectional view of an alternative embodiment used for comparison with FIG. 1(f) to illustrate the advantages of the FIG. 1(f) embodiment.

FIG. 1(g) is a sectional view showing an example of a semiconductor laser device for comparison with this embodiment. The drawing shows only the mesa-stripe portion. In FIG. 1(g), a reference numeral 1 denotes an n-GaAs substrate; 2 an n-GaAl.As cladding layer; 3 an n-GaAlAs optical guiding layer; 4 a GaAlAs active layer; 5 a p-GaAlAs cladding layer; and 6 a p-GaAls cap layer. In this example, after the above-mentioned layers are grown, these layers are etched so as to form a mesa as a whole. The etching for forming mesa-stripe is effected along such a direction that the cross-sectional configuration of the completed mesa-stripe will be an inverted trapezoid having the upper side larger than the lower side. Thereafter, only the two cladding layers 2, 5 are selectively etched to obtain a mesa as shown in FIG. 1(g). In the semiconductor laser device having the thus formed mesa as illustrated in FIG. 1(g), however, unlike the mesa of FIG. 1(f), the upper end of the n-cladding layer 2 is smaller in width than the lower end of the p-cladding layer 5; hence, continuing the selective etching causes the upper end portion of the n-cladding layer 2 to be exceedingly narrow so that this portion may break. In consequence, it is difficult to make the width of the active layer 4 directly under the p-cladding layer 5 smaller than several $\mu m$. Accordingly, this structure has a problem in stabilizing the transverse mode of a high-output semiconductor laser device.

Such a problem has been thoroughly overcome in the embodiment in accordance with FIG. 1(f).

As a matter of course, the principal objects of the invention can be attained by employing the mesa-stripe structure shown in FIG. 1(g) if the manufacture is carried out with great care. However, this is not a form best suitable for mass production.

Embodiment 2

Figure 2:
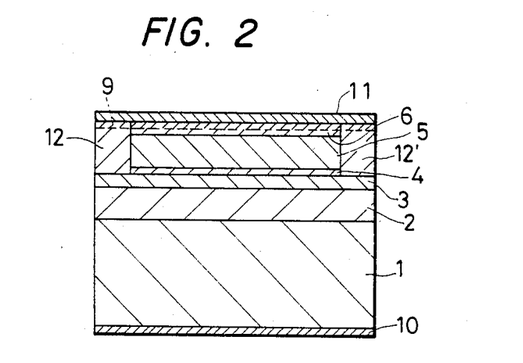
FIGS. 2, 3, 4, 10, 12, 13 and 14 are sectional views of semiconductor laser devices in accordance with other embodiments of the invention, respectively.

FIG. 2 is a sectional view of a semiconductor laser device in accordance with a second embodiment of the invention. The drawing is a sectional view taken along a plane parallel to the optical axis of the laser beam, although in FIGS. 1(a) to 1(f) the laser beam radiation direction is shown as perpendicular to the paper surface.

In the second embodiment shown in FIG. 2, the end surfaces are made transparent with respect to the laser beam (it is only necessary to employ a material having a large band gap). After the mesa-stripe as shown in FIG. 1(d) in the first embodiment is formed, only end surface portions 12, 12' of the p-$Ga_{0.8}Al_{0.2}As$ cap layer 6, the p-$Ga_{0.55}Al_{0.45}As$ cladding layer 5 and the active layer 4 are removed by means of a selective etching. Thereafter, in the same manner as that for growing the buried layers in the first embodiment, the outside of the mesa-stripe is embedded with GaAlAs layers of the same kind (FIG. 1(e)). It is to be noted that the width of the buried regions 12, 12' at the luminescent end surfaces is frequently selected to fall between about 10 $\mu m$ and about 30 $\mu m$. Since an excessively small width makes the manufacture difficult, a practical width is between about several $\mu m$ and about 5 $\mu m$. On the other hand, an excessively large width offers more problems such as the diffusion of the beam.

Thus, the element in accordance with the second embodiment has such a structure that the optical guiding layer 3 extends to the reflecting end surfaces of the laser resonator, while the end surfaces of the active layer 4 are on the inside of the corresponding reflecting end surfaces.

According to this embodiment, it is possible to obtain a visible semiconductor laser which is stable in the single transverse mode up to an optical output of 50 mW with an oscillation wavelength of 780 nm as well as has a maximum optical output of 1 W. More specifically, it is obvious that this embodiment is considerably effective in increasing the output and stabilizing the transverse mode at a high output.

Embodiment 3

Moreover, according to the invention, the transverse mode can be better stabilized and the output can be increased by making the refractive index of the cladding layer provided closer to the optical guiding layer larger than that of the cladding layer provided opposite to the first-mentioned cladding layer. These advantageous effects will be explained hereinunder.

It is to be noted that the advantageous effects can be offered even if the optical confinement region is formed by laminating the first to fourth semiconductor layers in reverse order to the above-mentioned.

Figure 3:
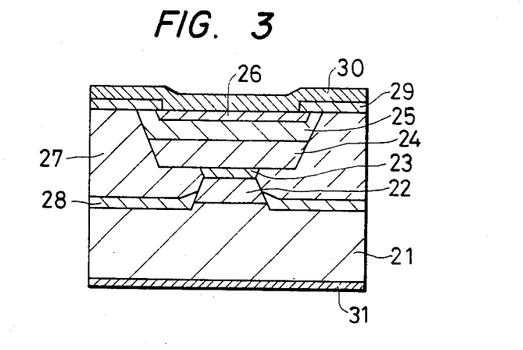

In such a semiconductor laser device as shown in FIG. 3 in section, a hetero barrier $\Delta Ew$ between an active layer 23 and an optical guiding layer 24 is smaller than a hetero barrier $\Delta Ec$ between the active layer 23 and an n-cladding layer 22, and the effective mass of minority carrier electrons is smaller than that of positive holes. In consequence, electrons are readily leaked through the hetero barrier $\Delta Ew$ by means of a thermal excitation, which impairs temperature characteristics of the threshold current, disadvantageously. Therefore, the conductivity type of the optical guiding layer 24 is selected to be n, thereby to improve the temperature characteristics. It is to be noted that in FIG. 3: a reference numeral 21 denotes an n-GaAs substrate; 22 an n-$Ga_{0.5}Al_{0.5}As$ cladding layer; 23 a $Ga_{0.95}Al_{0.05}As$ active layer; 24 a p-$Ga_{0.76}Al_{0.24}As$ optical guiding layer; 25 a p-$Ga_{0.63}Al_{0.37}As$ cladding layer; 26 a Zn-diffused layer; 27 an n-$Ga_{1-x}Al_xAs$ layer (x=0.3 or 0.6); 28 a p-$Ga_{0.4}Al_{0.6}As$ layer; 29 an $SiO_2$ layer; 30 a p-side electrode; and 31 an n-side electrode. It is to be noted also that the drawing is a sectional view taken along a plane perpendicular to the traveling direction of the laser beam.

Figure 4:
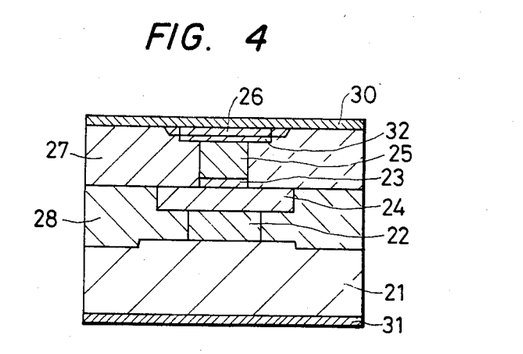

On the other hand, even if the conductivity type of the optical guiding layer 24 is selected to be n as in the case of a semiconductor laser device shown in FIG. 4, when the p-cladding layer 25 and the n-cladding layer 22 are equal in refractive index to each other, it is unfavorably difficult to effect both an increase in output and the stabilization of the transverse mode at the same time through the enlargement of the optical spot size. Such a problem will be explained hereinunder on the basis of results of the waveguide analysis by means of the effective refractive index approximation carried out on a visible semiconductor laser having a wavelength of 0.78 μm.

It is to be noted that in FIG. 4: a reference numeral 21 represents an n-GaAs substrate; 22 an n-Ga$_{0.55}$Al$_{0.45}$As cladding layer; 23 a Ga$_{0.86}$Al$_{0.14}$As active layer; 24 an n-Ga$_{0.74}$Al$_{0.26}$As optical guiding layer; 25 a p-Ga$_{0.55}$Al$_{0.45}$As cladding layer; 26 a Zn-diffused layer; 27 an n-Ga$_{0.55}$Al$_{0.45}$As layer; 28 a p-Ga$_{0.55}$Al$_{0.45}$As layer; 30 a p-side electrode; and 31 an n-side electrode.

Figure 5:
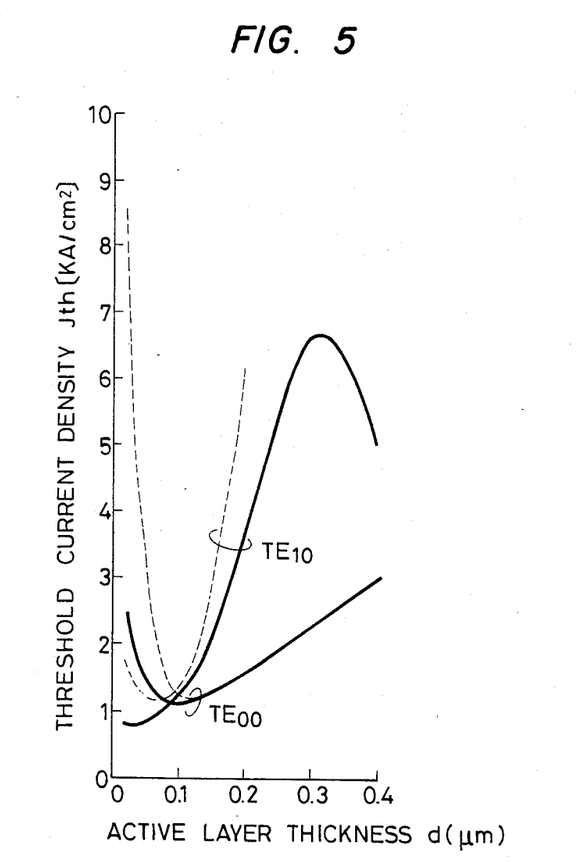
FIG. 5 is a graph showing the relationship between the threshold current density $J_{th}$ and the active layer thickness d in the $TE_{00}$ and $TE_{10}$ modes in the case where cladding layers are equal in refractive index to each other.
Figure 6:
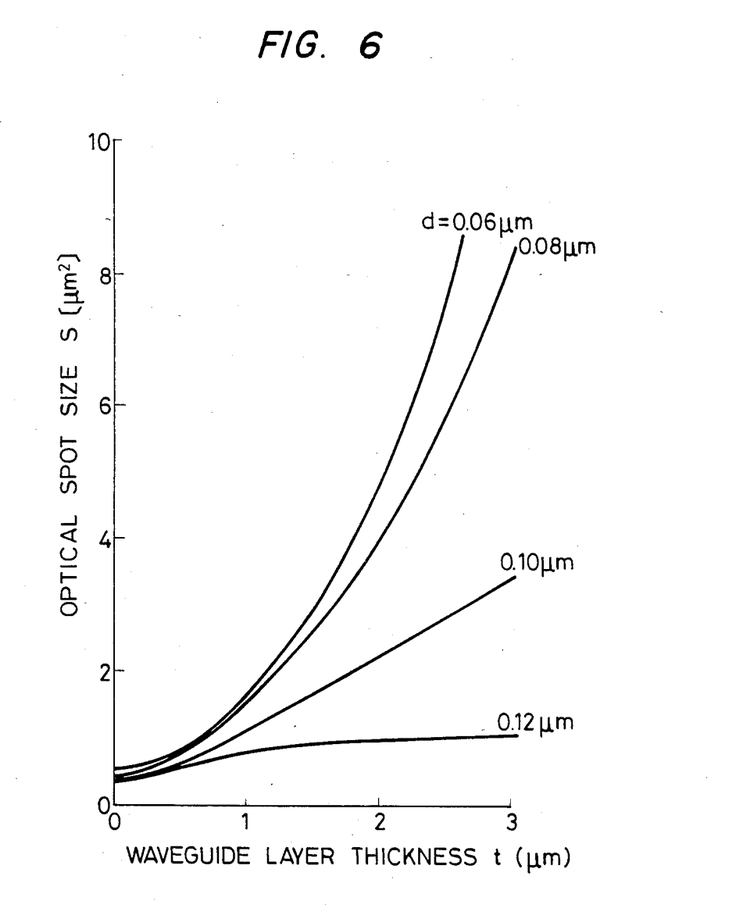
FIG. 6 is a graph showing the relationship between the optical spot size s and the waveguide layer thickness t in the case where cladding layers are equal in refractive index to each other.
Figure 7:
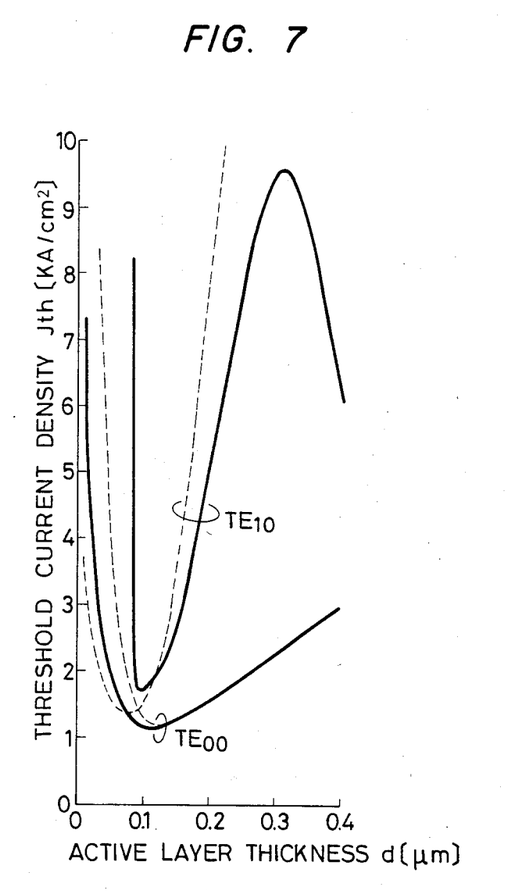
FIG. 7 is a graph showing the relationship between the threshold current density $J_{th}$ and the active layer thickness d in the $TE_{00}$ and $TE_{10}$ modes in the case where cladding layers are different in refractive index from each other.
Figure 8:
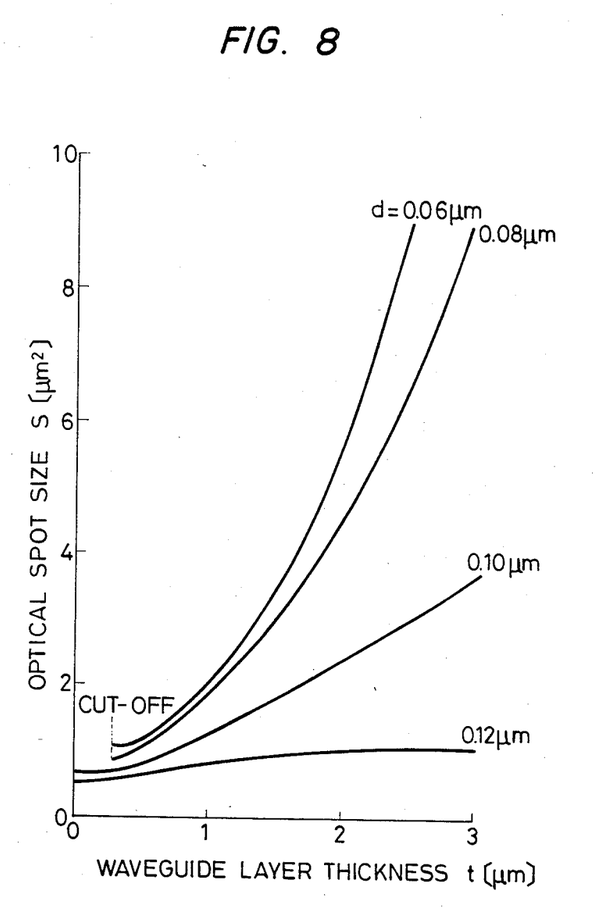
FIG. 8 is a graph showing the relationship between the optical spot size s and the waveguide layer thickness t in the case where cladding layers are different in refractive index from each other.

FIG. 5 is a graph showing an example of the dependency of the threshold current density $J_{th}$ (KA/cm$^2$) on the active layer thickness d (μm) in a structure in which the p-cladding layer and the n-cladding layer have the same refractive index, plotted with respect to the TE$_{00}$ mode and the TE$_{10}$ mode. In this case, the active layer width is 3 μm. Solid lines represent the dependency in the case where the waveguide layer thickness is 0.8 μm, while dotted lines express the dependency in the case where the waveguide layer thickness is 1.2 μm. As will be clear from the drawing, in the region where the active layer thickness d is smaller than about 0.1 μm, the higher order mode TE$_{10}$ is smaller in the threshold current density $J_{th}$ than the fundamental mode TE$_{00}$, so that the transverse mode has a higher order undesirably. Accordingly, in order to make the threshold current density $J_{th}$ in the TE$_{10}$ mode sufficiently larger than the threshold current density $J_{th}$ in the TE$_{00}$ mode, the active layer thickness d must be selected to fall between about 0.15 μm and about 0.4 μm. On the other hand, according to FIG. 6 which shows the relationship between the optical spot size s and the active layer thickness d in the case where the p-cladding layer and the n-cladding layer are equal in refractive index to each other, when the thickness d becomes as large as about 0.12 μm, the optical spot size hardly enlarges, so that it is impossible to increase the output. Accordingly, it is understood that in the structure in which the p-cladding layer and the n-cladding layer have the same refractive index, it is difficult to control the transverse mode and increase the output at the same time. FIG. 7 is a graph showing the dependency of the threshold current density $J_{th}$ on the active layer thickness d in a structure in which the AlAs mixed crystal ratio x of the cladding layer provided closed to the optical guiding layer is selected to be 0.30 (refractive index: 3.465), while the mixed crystal ratio x of the cladding layer provided closer to the active layer is 0.45 (refractive index: 3.335). Characteristics represented by solid lines and dotted lines are measured in cases similar to those in FIG. 5, respectively. It is obvious from the drawing that in the case where the waveguide layer thickness t is 0.8 μm, when the active layer thickness d becomes smaller than about 0.08 μm, the threshold current density $J_{th}$ in the higher order mode TE$_{10}$ becomes large sharply. This is because when the waveguide layer thickness t and the active layer thickness d decrease to a certain extent the higher order mode is no longer available (referred to as "cut off"), because of an asymmetric structure in which the p- and n-cladding layers are different in refractive index from each other. On the other hand, FIG. 8 is a graph showing the relationship between the optical spot size d and the active layer thickness t in an asymmetric structure in which the p- and n-cladding layers are different in refractive index from each other. In the case where the waveguide layer thickness t is about 0.8 μm at which the higher order mode is cut off, and the active layer thickness d is from 0.06 to 0.08 μm, when the stripe width w is 3 μm, the optical spot size s is from about 1.5 to about 1.7 μm$^2$. According to the definition of the optical spot size employed herein, in a conventional CPS type laser the optical spot size s is about 1.2 μm$^2$, and in a conventional BH type laser the size s is about 0.8 μm$^2$. Therefore, when the stripe width w is 3 μm, the spot size s of the laser in accordance with the invention becomes from about 25 to about 40% larger than that of the CPS type laser and from about 90 to about 110% larger than that of the BH type laser. As described above, the invention makes it possible to realize a high-output semiconductor laser having a stable transverse mode by providing an asymmetric structure in which the p-cladding layer and the n-cladding layer are different in refractive index from each other (the refractive index difference preferably falls between 0.01 and 0.20).

Figure 9A:
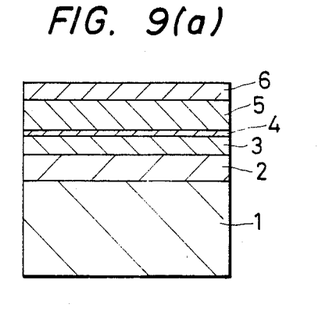
Figure 9B:
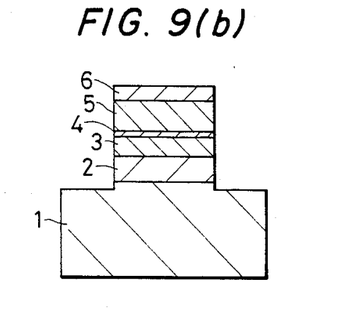
Figure 9C:
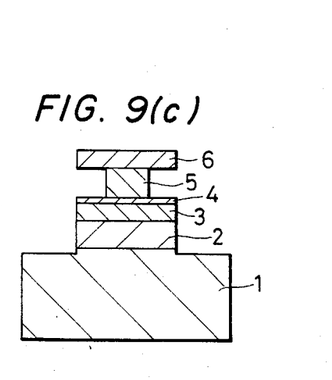
Figure 9D:
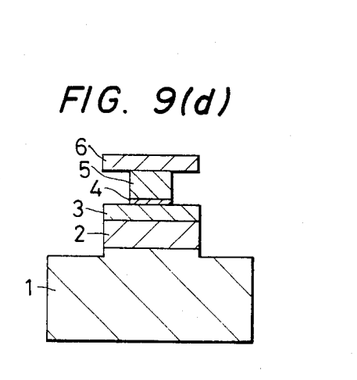
Figure 9E:
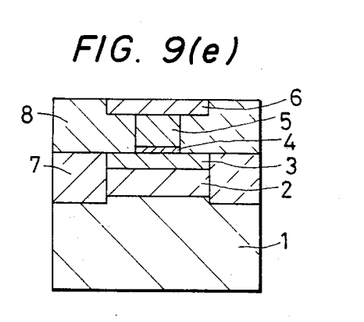
Figure 9F:
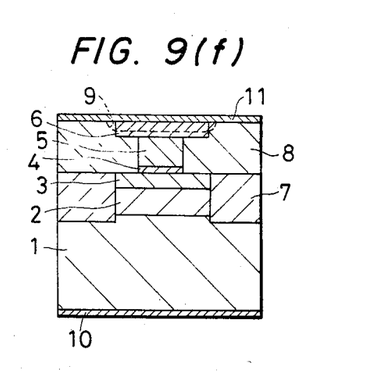

FIGS. 9(a) to 9(f) are sectional views showing a method of manufacturing a semiconductor laser device in the case where the above-described technique is applied to a GaAlAs semiconductor laser device. The fundamental steps are similar to those in the embodiment 1. As shown in FIG. 9(a), an n-GaAs substrate 1 is provided thereon with an n-Ga$_{0.70}$Al$_{0.30}$As cladding layer 2, an n-Ga$_{0.74}$Al$_{0.26}$As optical guiding layer 3, an undoped Ga$_{0.86}$Al$_{0.14}$As active layer 4, a p-Ga$_{0.55}$Al$_{0.45}$As cladding layer 5 and a p-Ga$_{0.80}$Al$_{0.20}$As cap layer 6 in order by means of liquid phase epitaxial growth. Then, etching is carried out to form a mesa-stripe as shown in FIG. 9(b). In forming this mesa, it is necessary to effect the etching until the GaAs substrate is exposed in order to facilitate the growth of buried layers carried out later. In the laser having the structure in accordance with the invention, the optical guiding layer must be larger in width than the active layer in the direction perpendicular to the mesa stripe; therefore, in this embodiment only the Ga$_{0.55}$Al$_{0.45}$As constituting the p-cladding layer is etched from about 1 to about 3 μm from both sides by means of a selective etching as shown in FIG. 9(c). In this case, HF is employed as a selective etching solution. Unlike the embodiment shown in FIG. 1(c), the semiconductor layer 2 is not etched for reason of the mole fraction of AlAs of the semiconductor layer 2. Thereafter, the mesa-stripe side surfaces of the active layer exposed by the selective etching are removed by an H$_3$PO$_4$ etchant to form a structure as shown in FIG. 9(d) in section. Then, the mesa-stripe is embedded with a p-Ga$_{0.55}$Al$_{0.45}$As buried layer 7 and an n-Ga$_{0.55}$Al$_{0.45}$As buried layer 8 by means of liquid phase epitaxial growth (FIG. 9(e)). Since the region other than the meas-stripe region has a reverse bias, the current flows only through the mesa-stripe region. These buried layers may be constituted by Ga$_{0.55}$Al$_{0.45}$As high-resistance layers, respectively. FIG. 9(f) is a sectional view of a completed element. The element is completed by selectively or totally diffusing Zn 9 and then forming ohmic electrodes 10, 11.

According to this embodiment, it is possible to obtain an element with an excellent reproducibility which can oscillate in the fundamental transverse mode up to an optical output range between 30 and 50 mWCW with an oscillation wavelength of 0.78 μm and a mesa-stripe width of from 3 to 5 μm and has excellent temperature characteristics.

Embodiment 4

Figure 10:
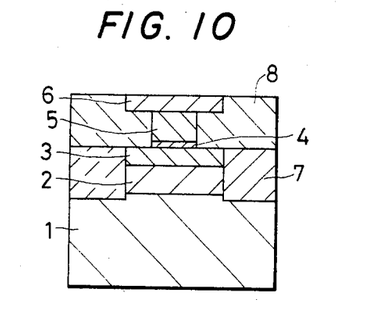
Figure 11:
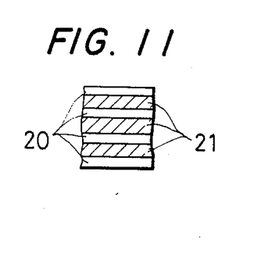
FIG. 11 shows an example of a fine structure of an active layer.

FIG. 10 shows a semiconductor laser device having the structure in accordance with the embodiment 3. In this embodiment, instead of the liquid phase epitaxial growth, MO.CVD or MBE technique is employed for manufacture, and particularly the active layer 4 is of quantum well type. More specifically, as shown in FIG. 11, the active layer 4 is constituted by a multiple quantum well (MQW) type active layer formed by alternately laminating three $Ga_{0.90}Al_{0.10}As$ quantum well layers each having a thickness of 120 Å and four $Ga_{0.65}Al_{0.35}As$ barrier wall layers 20 each having a thickness of 30 Å. According to this embodiment, it is possible to obtain an element which can oscillate in the fundamental transverse mode up to an optical output of 100 mW with an oscillation wavelength range between 0.76 and 0.80 μm and has excellent temperature characteristics and a low threshold current (not larger than 30 mA).

Embodiment 5

Figure 12:
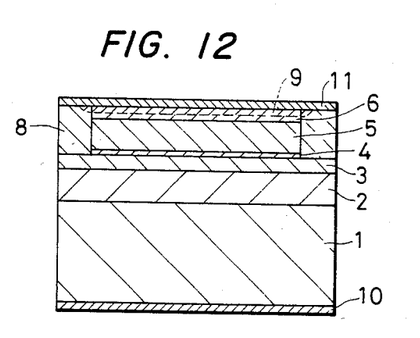

FIG. 12 is a sectional view taken along a plane parallel to the optical axis of the laser beam, showing the structure of the semiconductor laser device in accordance with the embodiment 3 or 4 having the end surfaces thereof made transparent with respect to the laser beam. In this structure, the optical guiding layer 3 extends to both laser beam reflecting end surfaces, while the end surfaces of the active layer 4 are on the inside of the corresponding laser beam reflecting end surfaces. After the mesa-stripe shown in FIG. 9(d) is formed, the end surface portions of only the p-$Ga_{0.80}Al_{0.20}As$ cap layer 6, the p-$Ga_{0.55}Al_{0.45}As$ cladding layer 5 and the active layer 4 are removed by means of a selective etching. Thereafter, the outside of the mesa-stripe is embedded with GaAlAs layers by means of the same buried layer growing method as that in the case of the embodiment 1.

By employing the structure in accordance with the embodiment 1 and making the end surfaces thereof transparent in accordance with this embodiment, it is possible to obtain a visible semiconductor laser device which can oscillate in the fundamental transverse mode up to an optical output from 30 to 50 mW with an oscillation wavelength of 0.78 μm and has a maximum optical output of 1 W. On the other hand, by employing the structure in accordance with the embodiment 2 and making the end surfaces thereof transparent, it is possible to obtain a semiconductor laser which can oscillate in the fundamental transverse mode up to an optical output of 100 mW with an oscillation wavelength range between 0.76 and 0.80 μm and has a maximum optical output of 2 W.

Embodiment 6

In this embodiment, a current blocking layer (buried layer) is further provided to control the interface position with respect to the active layer, thereby to reduce a reactive current for lowering the threshold current value.

Figure 13A:
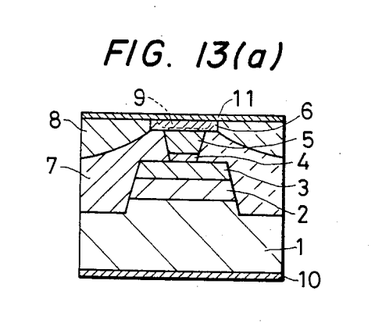
Figure 13B:
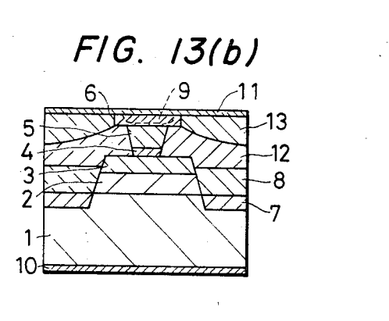

FIG. 13 is a sectional view of a semiconductor laser in the case where the invention is applied to a GaAlAs semiconductor laser. FIG. 13(a) is a sectional view of the semiconductor laser having a single current blocking layer, while FIG. 13(b) is a sectional view of the semiconductor laser having two current blocking layers.

First of all, an n-GaAs substrate 1 is provided thereon with an n-$Ga_{0.66}Al_{0.34}As$ cladding layer 2 (thickness: from 0.8 to 2 μm), an n-$Ga_{0.7}Al_{0.3}As$ optical guiding layer 3 (from 0.4 to 3 μm), an undoped $Ga_{0.86}Al_{0.14}As$ active layer 4 (from 0.04 to 0.4 μm), a p-$Ga_{0.5}Al_{0.5}As$ cladding layer 5 (from 0.8 to 2 μm) and a p-$Ga_{0.8}Al_{0.2}As$ cap layer 6 (from 0.5 to 1 μm) in order by means of liquid phase epitaxial growth. In this case, the n- and p-cladding layers are set to be smaller in refractive index than the active layer and the optical guiding layer, and the refractive index of the optical guiding layer is made smaller than that of the active layer. In addition, the mole fraction of AlAs of each layer may be properly selected within a range where the above-mentioned magnitude relationships among the refractive indexes are satisfied. In this embodiment, the cap layer is constituted by the $Ga_{0.8}Al_{0.2}As$ layer in order to prevent any epitaxial layer from being grown on the mesa-stripe in growing buried layers as well as allow an ohmic contact to be readily obtained as much as possible.

Next, after a photoetching step, etching is effected along such a direction that the cross-sectional configuration will be trapezoidal, to form a mesa-stripe. Moreover, the p-$Ga_{0.5}Al_{0.5}As$ cladding layer 5 is selectively etched to reduce the width thereof.

Then, the portions of the active layer 4 exposed by the selective etching are removed by means of etching.

Next, the sides of the mesa-stripe are embedded with a multilayer film including at least one layer of a current blocking layer which is larger in forbidden band width but smaller in refractive index than the active layer and has the conductivity type (p-type in this embodiment) opposite to that of the substrate. In the case of FIG. 13(a), first, a p-$Ga_{0.5}Al_{0.5}As$ current blocking layer 7 is provided, and then an n-$Ga_{0.5}Al_{0.5}As$ layer 8 is provided thereon. In this case, the current blocking layer 7 and the n-$Ga_{0.5}Al_{0.5}As$ layer 8 are provided so that the interface therebetween is in contact with the cap layer 6 at the side portions of the mesa-stripe. In addition, it is necessary to make the current blocking layer 7 smaller in carrier density than the p-cladding layer 5. In this embodiment, the carrier density of the p-cladding layer 5 is selected to be $6 \times 10^{17} cm^{-3}$, while the carrier density of the current blocking layer 7 is selected to be $1 \times 10^{17-3}$. In the case of FIG. 13(b), first, the p-$Ga_{0.5}Al_{0.5}As$ current blocking layer 7 is provided, and then the n-$Ga_{0.5}Al_{0.5}As$ layer 8, a p-$Ga_{0.5}Al_{0.5}As$ current blocking layer 12 and an n-$Ga_{0.5}Al_{0.5}As$ layer 13 are provided thereon in mentioned order. In this case, the current blocking layer 12 and the n-$Ga_{0.5}Al_{0.5}As$ layer 13 are provided so that the interface therebetween is in contact with the cap layer 6 at the side portions of the mesa-stripe, and the side portions of the active layer 4 are embedded with the current blocking layer 12. Also in this embodiment, the carrier densities of the p-cladding layer 5 and the current blocking layer 12 are selected to be $6 \times 10^{17} cm^{-3}$ and $1 \times \times 10^{17} cm^{-3}$, respectively.

Ideally, it is desirable that the interface between the current blocking layer 7 and the n-$Ga_{0.5}Al_{0.5}As$ layer 8 in FIG. 13(a) and the interface between the current blocking layer 12 and the n-$Ga_{0.5}Al_{0.5}As$ layer 13 should be coincident in position with the active layer 4 or immediately in the vicinity thereof. In the SBH (Stripe Buried Heterostructure) type laser having a mesa-stripe structure as shown in this embodiment, however, it is exceedingly difficult to control so that the position of the above-mentioned interface is in the vicinity of the active layer 4 at all times. On the other hand, it is easy to control so that the interface is in contact with the cap layer 6 as in this embodiment. Moreover, in the buried layers only the current blocking layer embedding the side portions of the active layer may be constituted by a GaAlAs layer which is larger in forbidden band width but smaller in refractive index than the active layer.

Then, Zn 9 is selectively diffused in the surface layer of the mesa-stripe region (in this embodiment, however, the Zn 9 may be diffused in the whole surface layer since the current blocking layer is provided in the regions other than the mesa-stripe region). Reference numerals 10, 11 denote an n-side electrode and a p-side electrode, respectively.

Although the current blocking layer shown in FIG. 13(b) is constituted by the two layers, the current blocking layer may be constituted by more than two layers which are provided alternately with $Ga_{0.5}Al_{0.5}As$ layers. However, the side portions of the active layer 4 must always be embedded with at least one current blocking layer. By thus providing a multiplicity of current blocking layers, it is possible to more effectively prevent the current from flowing to any other regions than the mesa-stripe region.

Since the p-$Ga_{0.5}Al_{0.5}As$ layer is higher in resistivity than the n-$Ga_{0.5}Al_{0.5}As$ layer, it is possible to reduce the reactive current flowing through any other regions than the practical stripe region (corresponding to the active layer width), by employing such a structure that the side portions of the active layer 4 are embedded with the p-$Ga_{0.5}Al_{0.5}As$ layer (the current blocking layer 7 or 9) and at least one interface between the current blocking layer and the n-$Ga_{0.5}Al_{0.5}As$ layer provided subsequently thereto is in contact with the cap layer 6 at the side portions of the mesa-stripe, as in the case of this embodiment.

Figure 14:
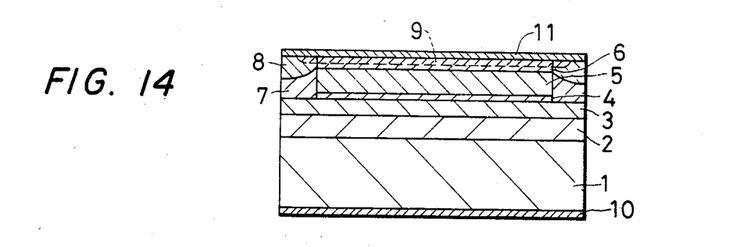

FIG. 14 is a sectional view taken along a plane in parallel to the optical axis of the laser beam, showing the structure of a semiconductor laser device as shown in FIG. 13(a) having its end surfaces made transparent with respect to the laser beam. In this structure, the optical guiding layer 3 extends to the laser beam reflecting end surfaces, while the end surfaces of the active layer 4 are on the inside of the corresponding laser beam reflecting end surfaces. After etching is effected along such a direction that a trapezoidal cross-section is obtained to form a mesa-stripe, the portions of only the p-$Ga_{0.8}Al_{0.2}As$ cap layer 6, the p-$Ga_{0.5}Al_{0.5}As$ cladding layer 5 and the active layer 4 which are in the vicinities of the corresponding end surfaces are removed by means of etching. Thereafter, the outside of the mesa-stripe is embedded by means of the buried layer growing method shown in the embodiment 1. In this case, as shown in FIG. 14, also the side portions of the active layer 4 in the direction parallel to the optical axis of the laser beam are embedded with the current blocking layer (the p-$Ga_{0.5}Al_{0.5}As$ layer 7 in this embodiment).

According to this embodiment, it is possible to obtain a visible semiconductor laser device having a threshold current reduced to the same extent as that in the above-described embodiment as well as a maximum optical output of 1 W. Moreover, since the current flowing through the portions near the laser beam reflecting end surfaces can be reduced, the damage on the end surfaces due to heat is also reduced to improve the reliability.

According to this embodiment, by controlling the position of the current blocking layer, the reactive current can be reduced, and the threshold current can be lowered. Accordingly, the reliability particularly in a high-output operation is improved.

It is to be noted that the composition shown in each embodiment is not exclusive and x in each $Ga_{1-x}Al_xAs$ layer may be selected within a range of $0 \leq x \leq 1$ to carry out the invention. In addition, the invention can be applied to other semiconductor laser devices employing compound semiconductors such as InGaAsP and InGaP in addition to GaAlAs semiconductors. Moreover, a p-type substrate may be employed, and in such a case, it is only necessary to make all the epitaxial layers opposite in conductivity type to those in the above-described embodiments.

What is claimed is:

1. A semiconductor laser device comprising:
   an optical confinement region comprising first, second, third and fourth semiconductor layers provided on the upper part of a predetermined semiconductor substrate in contact with each other successively, said first and fourth semiconductor layers being smaller in refractive index than said second and third semiconductor layers, said third semiconductor layer being larger in refractive index than said second semiconductor layer, said second and fourth semiconductor layers being larger in forbidden bandwidth than said third semiconductor layer, and at least said first and fourth semiconductor layers being opposite in conductivity type to each other, wherein said optical confinement region is formed into a mesa-stripe having a pair of side walls which are substantially parallel to the traveling direction of a laser beam, said side walls being embedded with a fifth semiconductor layer, said mesa-stripe being trapezoidal with a lower surface in contact with said substrate being larger than an upper surface opposite said lower surface, and wherein the width of said second semiconductor layer in a section perpendicular to the traveling direction of the laser beam and in the direction parallel to a junction within said optical confinement region is made larger than that of said third semiconductor layer at a surface of said second semiconductor layer interfacing with said third semiconductor layer;
   a first electrode coupled to said substrate; and
   a second electrode coupled to said fourth semiconductor layer.

2. A semiconductor laser device according to claim 1, wherein, in a section taken along a plane parallel to the traveling direction of the laser beam, end portions of said second semiconductor layer extend to corresponding reflecting end surfaces of said optical confinement region, while end portions of said first semiconductor layer do not extend to the corresponding reflecting surfaces.

3. A semiconductor laser device according to claim 1, wherein said third and fourth semiconductor layers are substantially equal in width to each other at the interface therebetween, and the width of said fourth semiconductor layer at the surface thereof in contact with said third semiconductor layer is smaller than the width of said fourth semiconductor layer at the surface thereof opposite to the surface at said interface.

4. A semiconductor laser device according to claim 1, wherein said semiconductor layer embedding the side walls of said optical confinement region reaches said substrate.

5. A semiconductor laser device according to claim 3, wherein said second semiconductor layer extends to end surfaces of the laminated semiconductor layers, and at least one of end surfaces of said third semiconductor layer is on the inside of the corresponding end surface of said laminated semiconductor layers.

6. A semiconductor laser device according to claim 1, wherein a semiconductor layer is further laminated on said fourth semiconductor layer between said fourth semiconductor layer and said second electrode.

7. A semiconductor laser device according to claim 2, wherein a semiconductor layer is further laminated on said fourth semiconductor layer between said fourth semiconductor layer and said second electrode.

8. A semiconductor laser device according to claim 3, wherein a semiconductor layer is further laminated on said fourth semiconductor layer between said fourth semiconductor layer and said second electrode.

9. A semiconductor laser device according to claim 4, wherein a semiconductor layer is further laminated on said fourth semiconductor layer between said fourth semiconductor layer and said second electrode.

10. A semiconductor laser device according to claim 5, wherein a semiconductor layer is further laminated on said fourth semiconductor layer between said fourth semiconductor layer and said second electrode.

11. A semiconductor laser device according to claim 1, wherein the refractive index of said first semiconductor layer is different than the refractive index of said fourth semiconductor layer.

12. A semiconductor laser device according to claim 11, wherein the refractive index of said fourth semiconductor layer is greater than the refractive index of said first semiconductor layer.

13. A semiconductor laser device according to claim 11, wherein a refractive index difference between said first and fourth semiconductor layers is in a range between 0.01 and 0.20 inclusive.

14. A semiconductor laser device according to claim 12, wherein a refractive index difference between said first and fourth semiconductor layers is in a range between 0.01 and 0.20 inclusive.

15. A semiconductor laser device according to claim 1, wherein the refractive index of said first and fourth semiconductor layers is substantially identical.

16. A semiconductor laser device according to claim 1, wherein said first semiconductor layer is an n-conductivity cladding layer, said second semiconductor layer is an n-conductivity optical guiding layer, said third semiconductor layer is an undoped active layer and said fourth semiconductor layer is a p-conductivity cladding layer.

17. A semiconductor laser device according to claim 16, wherein said n-conductivity cladding layer and said p-conductivity cladding layer have different refractive indexes from one another.

18. A semiconductor laser device according to claim 16, wherein said substrate is n-conductivity.

19. A semiconductor laser device according to claim 17, wherein said substrate is n-conductivity.

20. A semiconductor laser device comprising:
an optical confinement region comprising first, second, third and fourth semiconductor layers provided on the upper part of a predetermined semiconductor substrate in contact with each other successively, said first and fourth semiconductor layers being smaller in refractive index than said second and third semiconductor layers, said third semiconductor layer being larger in refractive index than said second semiconductor layer, said second and fourth semiconductor layers being larger in forbidden bandwidth than said third semiconductor layer, and at least said first and fourth semiconductor layers being opposite in conductivity type to each other, wherein said optical confinement region is formed into a mesa-stripe having a pair of side walls which are substantially parallel to the traveling direction of a laser beam, said side walls being embedded with a fifth semiconductor layer, and wherein the width of said second semiconductor layer in a section perpendicular to the traveling direction of the laser beam and in the direction parallel to a junction within said optical confinement region is made larger than that of said third semiconductor layer;
a first electrode coupled to said substrate; and
a second electrode coupled to said fourth semiconductor layer,
wherein, in a section taken along a plane parallel to the traveling direction of the laser beam, end portions of said second semiconductor layer extend to corresponding reflecting end surfaces of said optical confinement region, while end portions of said first semiconductor layer do not extend to the corresponding reflecting surfaces.

21. A semiconductor laser device comprising:
an optical confinement region comprising first, second, third and fourth semiconductor layers provided on the upper part of a predetermined semiconductor substrate in contact with each other successively, said first and fourth semiconductor layers being smaller in refractive index than said second and third semiconductor layers, said third semiconductor layer being larger in refractive index than said second semiconductor layer, said second and fourth semiconductor layers being larger in forbidden bandwidth than said third semiconductor layer, and at least said first and fourth semiconductor layers being opposite in conductivity type to each other, wherein said optical confinement region is formed into a mesa-stripe having a pair of side walls which are substantially parallel to the traveling direction of a laser beam, said side walls being embedded with a fifth semiconductor layer in a section perpendicular to the traveling direction of the laser beam and in the direction parallel to a junction within said optical confinement region is made larger than that of said third semiconductor layer;
a first electrode coupled to said substrate; and
a second electrode coupled to said fourth semiconductor layer,
wherein, said third and fourth semiconductor layers are substantially equal in width to each other at the interface therebetween, and the width of said fourth semiconductor layer at the surface thereof in contact with said third semiconductor layer is smaller than the width of said fourth semiconductor layer at the surface thereof opposite to the surface at said interface.

22. A semiconductor laser device according to claim 21, wherein said second semiconductor layer extends to end surfaces of the laminated semiconductor layers, and at least one of end surfaces of said third semiconductor layer is on the inside of the corresponding end surface of said laminated semiconductor layers.

23. A semiconductor laser device according to claim 22, wherein a semiconductor layer is further laminated on said fourth semiconductor layer between said fourth semiconductor layer and said second electrode.

24. A semiconductor laser device comprising:

an optical confinement region comprising first, second, third and fourth semiconductor layers provided on the upper part of a predetermined semiconductor substrate in contact with each other successively, said first and fourth semiconductor layers being smaller in refractive index than said second and third semiconductor layers, said third semiconductor layer being larger in refractive index than said second semiconductor layer, said second and fourth semiconductor layers being larger in forbidden bandwidth than said third semiconductor layer, and at least said first and fourth semiconductor layers being opposite in conductivity type to each other, wherein said optical confinement region is formed into a mesa-stripe having a pair of side walls which are substantially parallel to the traveling direction of a laser beam, said side walls being embedded with a fifth semiconductor layer in a section perpendicular to the traveling direction of the laser beam and in the direction parallel to a junction within said optical confinement region is made larger than that of said third semiconductor layer;

a first electrode coupled to said substrate; and a second electrode coupled to said fourth semiconductor layer, wherein, the refractive index of said fourth semiconductor layer is greater than the refractive index of said first semiconductor layer, and wherein, a refractive index difference between said first and fourth semiconductor layers is in a range between 0.01 and 0.20 inclusive.

* * * * *